(12) United States Patent
Braswell

(10) Patent No.: US 7,671,774 B2
(45) Date of Patent: Mar. 2, 2010

(54) ANALOG-TO-DIGITAL CONVERTER WITH INTEGRATOR CIRCUIT FOR OVERLOAD RECOVERY

(75) Inventor: Brandt Braswell, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/117,357

(22) Filed: May 8, 2008

(65) Prior Publication Data

US 2009/0278719 A1 Nov. 12, 2009

(51) Int. Cl.
*H03M 3/00* (2006.01)
(52) U.S. Cl. ...................... 341/143; 341/155
(58) Field of Classification Search ............... 341/118, 341/120, 143, 155, 144
See application file for complete search history.

(56) References Cited

U.S. PATENT DOCUMENTS

| | | | | |
|---|---|---|---|---|
| 3,739,163 | A * | 6/1973 | Hirasawa et al. | 705/10 |
| 5,323,156 | A * | 6/1994 | Budmiger | 341/143 |
| 5,986,598 | A * | 11/1999 | Mittel | 341/143 |
| 6,040,793 | A | 3/2000 | Ferguson, Jr. et al. | |
| 6,061,009 | A * | 5/2000 | Krone et al. | 341/143 |
| 6,064,326 | A * | 5/2000 | Krone et al. | 341/143 |
| 6,275,177 | B1 | 8/2001 | Ho et al. | |
| 6,331,833 | B1 | 12/2001 | Naviasky et al. | |
| 2005/0200405 | A1* | 9/2005 | Shinohara et al. | 330/10 |

* cited by examiner

*Primary Examiner*—Peguy JeanPierre
(74) *Attorney, Agent, or Firm*—Ingrassia, Fisher & Lorenz, P.C.

(57) ABSTRACT

Apparatus and methods are provided for overload recovery in high order sigma-delta feedback topologies. An apparatus is provided for an analog-to-digital converter. The analog-to-digital converter comprises a first integrator having a first input, wherein the first integrator is configured to produce a first integrated output. A first switched resistance element is coupled between the first input and the first integrated output, wherein the first integrated output is altered when the first switched resistance element is activated. A quantizer is coupled to the first integrated output, the quantizer having a digital output wherein the quantizer converts the first integrated output to a digital value. A digital-to-analog converter is coupled between the digital output and the first input, wherein the digital-to-analog converter converts the digital value to an analog value.

20 Claims, 5 Drawing Sheets

ANALOG-TO-DIGITAL CONVERTER WITH INTEGRATOR CIRCUIT FOR OVERLOAD RECOVERY

TECHNICAL FIELD

Embodiments of the subject matter described herein relate generally to mixed-signal circuits, and more particularly, embodiments of the subject matter relate to integrator circuits for analog-to-digital converters using higher order sigma-delta modulation.

BACKGROUND

Analog-to-digital converters (ADCs) convert an analog input signal to a digital output value. However, because of the finite nature of digital representation, quantization error, the difference between the actual analog value and quantized digital value due to rounding or truncation, is an imperfection inherent to the analog-to-digital conversion.

In some ADCs, sigma-delta modulation is used to reduce the effects of quantization error and improve signal-to-noise ratio (SNR). Sigma-delta modulation (alternatively referred to as delta-sigma modulation) adds quantization error to a forward signal path using feedback loops and integrator circuits. The quantization error is sampled at a frequency greater than the analog input signal frequency, allowing it to be filtered at the integrators without noticeably impacting the signal.

To accommodate wide bandwidths and achieve wide dynamic range, higher order sigma-delta modulation feedback loops greater than second-order (i.e., more than two integrators) are often needed. However, higher order feedback loops suffer from instability under some input conditions. For example, a large input signal may cause an overload condition in the integrators. During an overload, the integrators do not output a signal representative of the input signal and the ADC does not produce useful data. Furthermore, an overload condition in the integrators can cause instability even when the input signal is reduced or removed, known as a runaway condition. If a runaway condition occurs, the ADC is reset in order to resume useful operation and remove the effects of the overload. Often, this involves short circuiting capacitors that are part of the integrators and waiting for downstream data (i.e., data in digital filters following the ADC) to be flushed from the system, resulting in an undesirable loss of data.

To avoid the overload and runaway conditions that occur in higher order feedback topologies, alternative topologies utilizing fewer feedback loops are often used. Higher order feed-forward topologies use high-frequency paths to a high-frequency summer. In the presence of an overloading signal, feed-forward topologies utilize an active limiting circuit to effectively limit the integrators and create a reduced order feedback loop allowing the ADC to recover from the overload. However, feed-forward topologies do not produce useful output data during an excessive or continuous overloading signal. Additionally, using high-frequency paths and high-frequency integrators increases the power and the surface area requirements for the ADC.

Other topologies, such as the multi-stage noise shaping (MASH) architecture, utilize cascaded first-order and second order loops and feed quantization error through stages to approximate the effect of higher order sigma-delta modulation feedback topologies. These topologies use additional digital filters and require matching the frequency response of the digital filters with the analog integrators, which is difficult, imperfect, and thus undesirable. Furthermore, while MASH and other topologies can recover from an overload and avoid runaway conditions, they do not produce useful output data in the presence of an excessive or continuous overloading signal.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
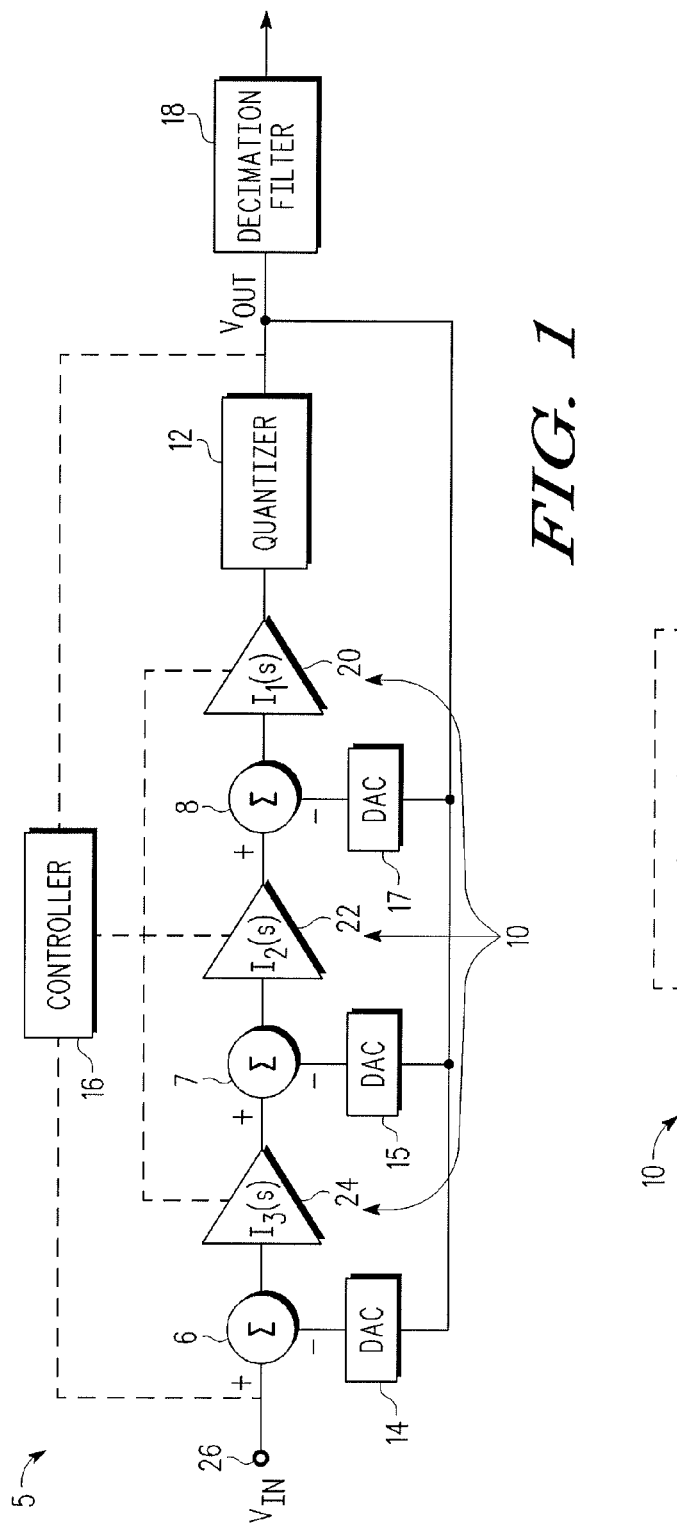
FIG. 1 is a block diagram of an analog-to-digital converter in accordance with one embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

The following description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

For the sake of brevity, conventional techniques related to signal processing, data transmission, analog-to-digital conversion, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter. It should be understood that circuitry described herein may be implemented either in silicon or another semiconductor material or alternatively by software code representation thereof. In addition, certain terminology may also be used in the following description for the purpose of reference only, and thus are not intended to be limiting, and the terms "first", "second" and other such numerical terms referring to structures do not imply a sequence or order unless clearly indicated by the context.

Technologies and concepts discussed herein relate to analog-to-digital conversion using high order sigma-delta feedback loops (alternatively referred to as delta-sigma). An analog input signal passes through a series of integrator circuits before being converted to a digital value. To reduce quantization error due to rounding or truncation, the digital value is oversampled and fed through the integrator circuits through feedback loops. The noise created by feeding back oversampled quantization error is filtered by the integrator circuits, resulting in an improved signal-to-noise ratio.

Referring now to FIG. 1, in an exemplary embodiment, an analog-to-digital converter 5 may comprise a plurality of integrators 10, a plurality of summing junctions 6, 7, 8, a quantizer 12, a plurality of digital-to-analog converters 14, 15, 17 (DACs), and a decimation filter 18. A controller 16 may be coupled to the integrators 10, the quantizer 12, and/or the DACs 14, 15, 17 and may be configured to perform additional processes, tasks, and functions as described in greater detail below. In an exemplary embodiment, the analog-to-digital converter 5 utilizes a third order sigma-delta feedback topology having a first integrator 20, a second integrator 22, and a third integrator 24. The elements of the analog-to-digital converter 5 may be coupled together as shown in FIG. 1 to facilitate the transfer of data and control signals during operation.

Referring again to FIG. 1, in an exemplary embodiment, an analog voltage source 26 is coupled to the input of the third integrator 24, via a first summing junction 6. The first summing junction 6 is also coupled to the output of a first DAC 14. The output of the third integrator 24 is coupled to the input of the second integrator 22, via a second summing junction 7. As shown, the second summing junction 7 is coupled to the output of a second DAC 15. The output of the second integrator 22 is coupled to the input of the first integrator 20, via a third summing junction 8, which is coupled to the output of a third DAC 17. In an exemplary embodiment, the output of the first integrator 20 is coupled to the input of the quantizer 12. The outputs of the DACs 14, 15, 17 are coupled to the input of the integrators 20, 22, 24 via the summing junctions 6, 7, 8 to create feedback loops as shown.

In an exemplary embodiment, the quantizer 12 (or A/D) converts an analog voltage level at the output of the first integrator 20 to a binary or digital representation. The quantizer 12 converts the output of the first integrator 20 to a digital value, $V_{OUT}$, which may be realized using any number of bits.

In an exemplary embodiment, the DACs 14, 15, 17 convert the digital value, $V_{OUT}$, to an analog voltage which is fed back to the summing junctions 6, 7, 8 and subtracted from the respective forward signal path components to estimate the amount of quantization error. In alternative embodiments, the DACs 14, 15, 17 may be implemented as current mode to convert the digital value to an analog current. In an exemplary embodiment, the sampling frequency ($f_s$) of the quantizer 12 and the DACs 14, 15, 17 are chosen to be substantially greater than the input signal frequency, as will be appreciated in the art. The decimation filter 18 downsamples (i.e., reduces the sampling rate and filters) the digital output before subsequent signal processing.

Depending on the embodiment, the integrators 20, 22, 24 may operate independently and the integrators 20, 22, 24 may comprise identical or different components, as discussed in greater detail below. The integrators 20, 22, 24 perform integration of the signal at their respective inputs by using a form of a first-order low-pass filter, which has the effect of integrating the oversampled quantization and input signals (during normal operation) until the integrators 20, 22, 24 reach a limit.

It should be understood that FIG. 1 is a simplified diagram of the analog-to-digital converter 5 depicted in single-ended form, and other embodiments may include additional or alternative components, and/or be implemented as a differential circuit. As shown, the analog-to-digital converter 5 comprises a third-order sigma-delta feedback topology, although it will be appreciated that the subject matter herein is not limited to third-order sigma-delta feedback loops. The subject matter may be extended to or adapted for an analog-to-digital converter of any order, and may apply to any device or application using an integrator circuit, as will be appreciated in the art.

Figure 2:
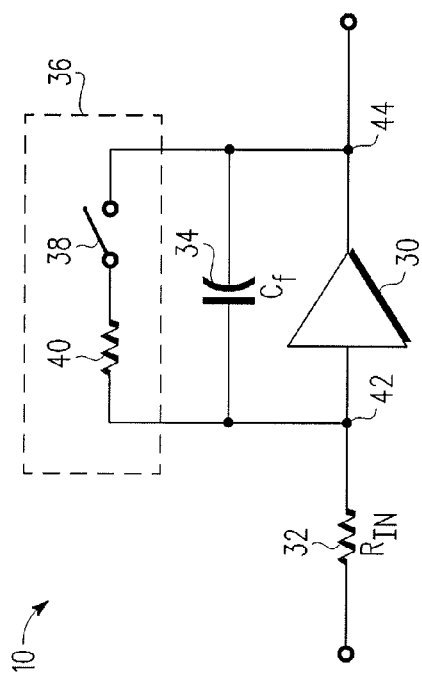
FIG. 2 is a schematic view of an integrator circuit in accordance with one embodiment.

Referring now to FIGS. 1-2, in an exemplary embodiment, an integrator 10 for use in the analog-to digital converter 5 may include an amplifier 30 having an input 42 and an integrating output 44, an input resistor 32, an integrating capacitor 34, and a switched resistance element 36. The input resistor 32 is coupled to the input 42 of the amplifier. The integrating capacitor 34 may be coupled between the input 42 and the integrating output 44 of the amplifier 30. The switched resistance element 36 is also coupled between the integrating output 44 and the input 42 as shown. In an exemplary embodiment, the switched resistance element 36 may include a switch 38 coupled in series with a feedback resistor 40. The switch 38 may be coupled to the integrating output 44 and the feedback resistor 40 may be coupled to the input 42 as shown. Depending on the embodiment, the input resistor 32 may be further coupled to an analog source 26 or the integrating output 44 of another integrator 10.

In accordance with one or more embodiments, the amplifier 30 may be an operational amplifier, a transconductance amplifier, or another suitable amplifier known in the art. The switch 38 may comprise any suitable switching device, such as a transistor, MOSFET, IGBT, etc. In alternative embodiments, other suitable current limiting elements for the input resistor 32 and the feedback resistor 40 may be used instead of or in addition to resistors, such as variable resistors, potentiometers, thermistors, thyristors, diodes, transistors, integrated circuits, and various combinations thereof.

In accordance with one embodiment, the switched resistance element 36 may be activated (i.e., by switching on and closing the switch 38) to alter the output generated at the integrating output 44 of the amplifier 30. Activating the switched resistance element 36 reduces the DC gain of the integrator 10 and affects the integrator 10 frequency response of the integrator 10. When the switched resistance element 36 is activated, the integrator 10 functions as a leaky integrator and does not accumulate a value when a DC input signal is applied. Using this integrator 10 in an analog-to-digital converter 5 results in a normally undesirable reduction in signal-to-noise ratio (SNR) of the analog-to-digital converter 5 when the switched resistance element 36 activated.

In an exemplary embodiment, the composite transfer function of the integrator 10 when the switched resistance element 36 is activated is governed by $$H(s) = \frac{\frac{1}{R_{in}C_f}}{s + \frac{1}{R_f C_f}},$$

where $R_{in}$ is the resistance of the input resistor 32, $R_f$ is the resistance of the feedback resistor 40, and $C_f$ is the capacitance of the integrating capacitor 34. Accordingly, the RC time constant for the integrator 10 in continuous time sigma-delta modulation is governed by $k_i \times f_s$, where $f_s$ is the sampling frequency of the analog-to-digital converter 5 and $k_i$ is an integrator scaling coefficient. In an exemplary embodiment, $k_i$ is equal to 1. Accordingly, the transfer function of the integrator 10 may be realized as $$I(s) = \frac{fs}{s + \frac{Rin \cdot fs}{R_f}},$$

where $R_{in}$ is the input resistor 32, and $R_f$ is the resistance of the feedback resistor 40. In an exemplary embodiment, the sampling frequency, input resistor 32, and integrating capacitor 34 are chosen such that $$f_s = \frac{1}{R_{in}C_f},$$

which represents the closed loop cutoff frequency of the integrator 10.

Figure 3:
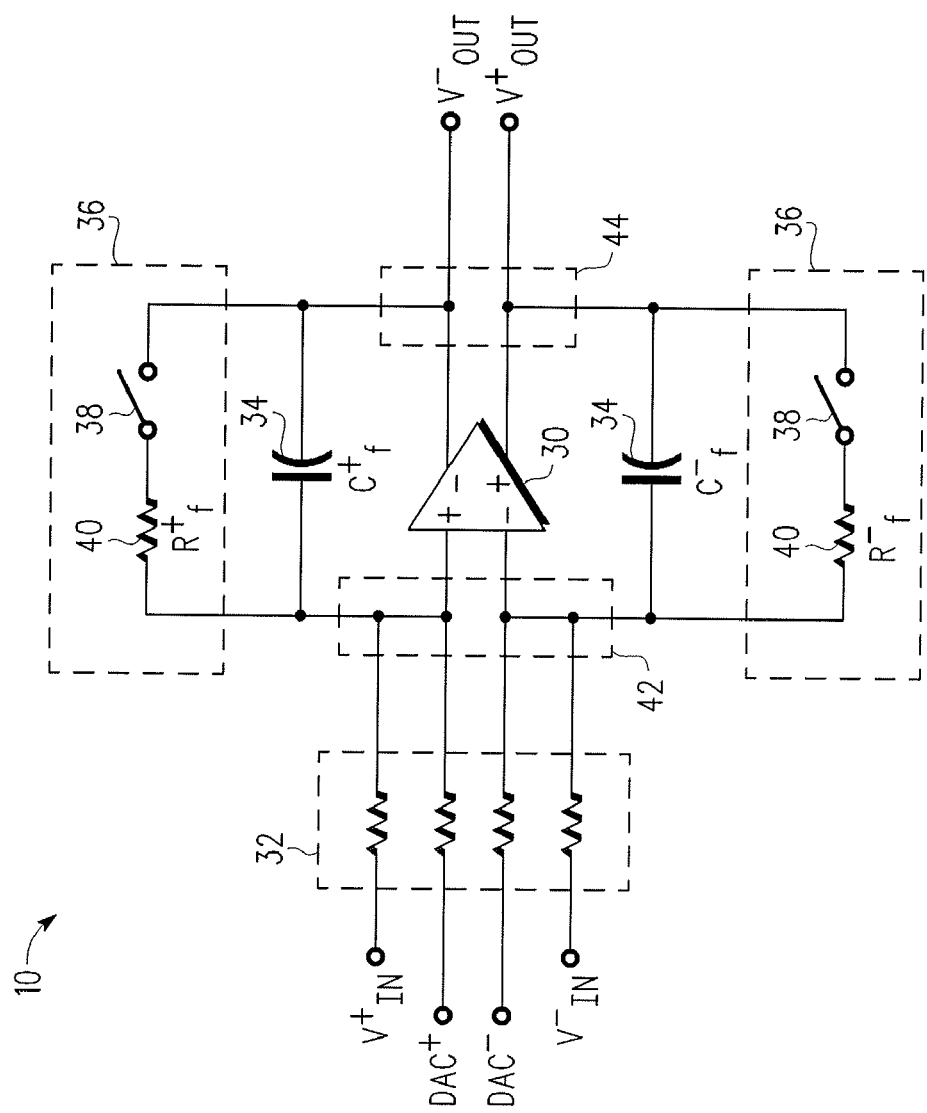
FIG. 3 is a schematic view of a differential implementation of the integrator circuit of FIG. 2 in accordance with one embodiment.

Referring now to FIG. 3, in an exemplary embodiment, the integrator 10 may be implemented as a differential circuit. It will be appreciated in the art that the differential circuit may be achieved using a differential amplifier 30 and implementing the circuitry shown in FIG. 2 in a balanced or symmetrical manner (i.e., using identical components for the + and the − paths). It should be noted that in alternative embodiments, if the DACs 14, 15, 17 utilized are implemented in current mode, the DAC paths (DAC⁺ and DAC⁻) can be implemented without including input resistors 32 for the respective signal paths.

Referring again to FIGS. 1-3, in an exemplary embodiment, the controller 16 may be configured to control the analog-to-digital converter 5 and perform the tasks, functions, and operations described below. The various tasks may be performed by software, hardware, firmware, or any combination thereof. For illustrative purposes, the following description may refer to elements mentioned above in connection with FIGS. 1-3. In practice, the tasks, functions, and operations may be performed by different elements of the described system. It should be appreciated any number of additional or alternative tasks may be included, and may be incorporated into a more comprehensive procedure or process having additional functionality not described in detail herein.

Referring again to FIGS. 1-3, the controller 16 may be configured to monitor the analog-to-digital converter 5, the analog source 26, and/or the integrators 20, 22, 24 for an overload condition or a runaway condition. An overload condition may be understood as a condition where the amplifiers 30 within one or more integrators 20, 22, 24 become saturated such that the digital output of the quantizer 12 is not representative of the analog input signal. An overload condition can be caused by an analog input signal that exceeds a threshold value, or a certain frequency. A runaway condition may be understood as a prolonged overload condition in the presence of an analog input signal which is independent of the input signal amplitude.

In accordance with one embodiment, the controller 16 may be configured to detect an overload condition at an input of the analog-to-digital converter 5, for example, by monitoring the analog input signal level, $V_{IN}$, and comparing it to a threshold value, $V_{TH}$. The threshold value may be determined to be the largest analog input signal which the analog-to-digital converter 5 can reliably tolerate without an overload or runaway condition. It will be appreciated in the art that the threshold value will largely be dependent on the integrator 10, and may vary depending on the component values chosen for the application. The controller 16 may be configured to activate the switched resistance element(s) 36 when the analog input voltage exceeds the threshold value (i.e., $V_{IN} > V_{TH}$), as discussed in greater detail below. In accordance with another embodiment, the controller 16 may detect an overload or runaway condition at the digital output of the quantizer 12. For example, a counter may be used to monitor the digital output for ones and zeros, and determine an overload based on a specified count or frequency, as will be appreciated in the art.

Figure 4:
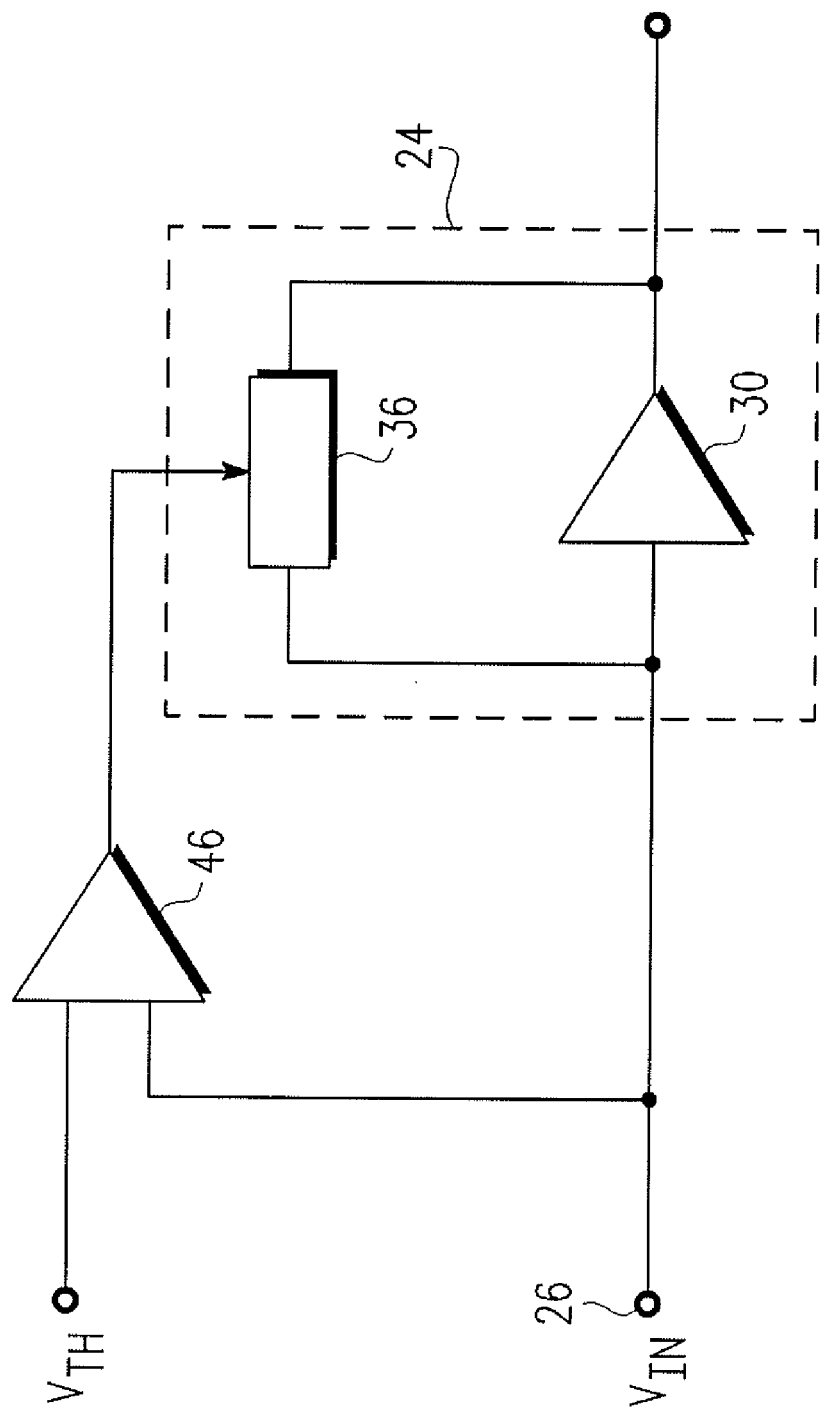
FIG. 4 is a schematic view of an overload detection circuit for the analog-to-digital converter of FIG. 1 in accordance with one embodiment.

Referring to FIGS. 1-4, in accordance with one embodiment, a comparator 46 may be used at the input of the third integrator 24 to determine or detect whether an input voltage level, $V_{IN}$, that exceeds a threshold value, $V_{TH}$. In accordance with one embodiment, the comparator 46 may be coupled to the switched resistance element 36 and configured to activate the switched resistance element 36 whenever the input voltage exceeds the threshold value (i.e., $V_{IN} > V_{TH}$). In alternative embodiments, the comparator 46 may be used with the controller 16, and/or may be coupled to other integrators 20, 22, 24 to monitor for an overload. It should be understood that the third integrator 24 is chosen for the purpose of illustration, and the location and/or interaction of the comparator 46 within the analog-to-digital converter 5 relative to the other components is not limited. Further, the comparator 46 and may be coupled to other components or signals, and additional comparators 46 may be used. It should be understood that although FIG. 4 depicts a single-ended implementation, the circuit of FIG. 4 may be adapted and implemented in a differential manner as will be understood in the art.

Referring again to FIGS. 1-3, in an exemplary embodiment, when an overload condition is detected, the switched resistance element 36 for one or more integrators 20, 22, 24 may be activated. Depending on the embodiment, the switched resistance elements 36 may be activated for the integrators 20, 22, 24 in concert or only a selected combination of switched resistance elements 36 may be activated as desired. Activating the switched resistance element 36 will reduce the gain of the integrator(s) 20, 22, 24 which is governed by the composite transfer function set forth above. The reduction in gain results in a degradation of signal-to-noise ratio (SNR) for the analog-to-digital converter 5. However, activating the switched resistance element 36 prevents an integrator 10 from suffering a runaway condition. Depending on the components selected ($R_{in}$, $R_f$, $C_f$), activating the switched resistance element(s) 36 may enable useful operation of the analog-to-digital converter 5 in the presence of a signal that would normally cause an overload condition (i.e., $V_{IN} > V_{TH}$). Additionally, the sigma-delta feedback loop can avoid and/or recover from an overload condition without any need to short circuit the integrating capacitor(s) 34.

Referring to FIGS. 1-3, depending on the selection of the feedback resistor 40 and input resistor 32, the analog-to-digital converter 5 can be adapted to accommodate a wide range of input voltage levels or achieve wider dynamic range. In an exemplary embodiment, when the feedback resistor 40 ($R_f$) is reduced relative to the input resistor 32 ($R_{in}$), the integrator 10 can accommodate a larger range of possible voltage inputs without suffering an overload or runaway condition. However, a lower ratio of $R_f$ relative to $R_{in}$ further reduces gain, and therefore SNR, when the switched resistance element 36 is activated. Increasing the ratio of $R_f$ relative to $R_{in}$ may improve SNR, however, the integrator 10 may not tolerate as large of an input voltage range and may be more susceptible to overload. It will be appreciated by those skilled in the art how the values of the input resistor 32 and feedback resistor 40 may be chosen to achieve desired results.

Figure 5:
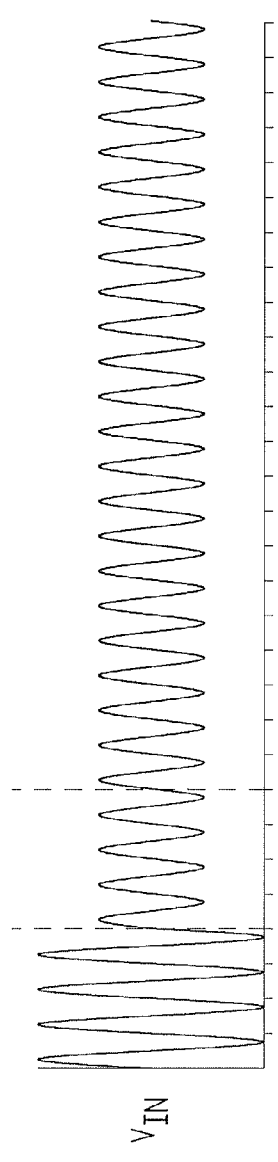
FIG. 5 is a graph of an analog input signal voltage versus time causing an overload and runaway condition for an analog-to-digital converter.
Figure 6:
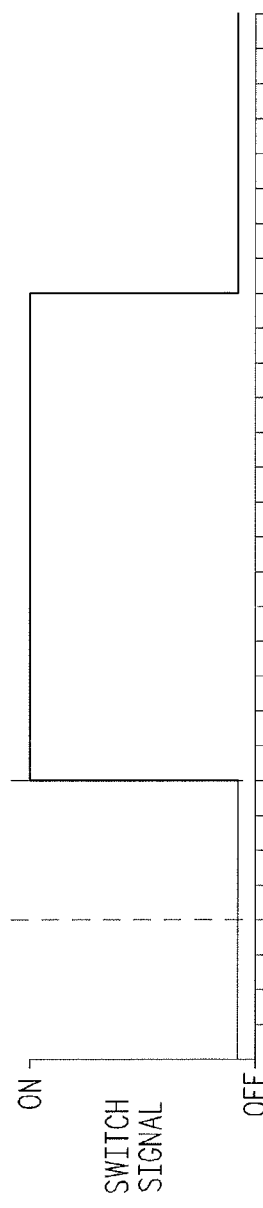
FIG. 6 is a graph of a switch signal versus time for a switched resistance element in an analog-to-digital converter having the overload and runaway condition shown in FIG. 5.
Figure 7:
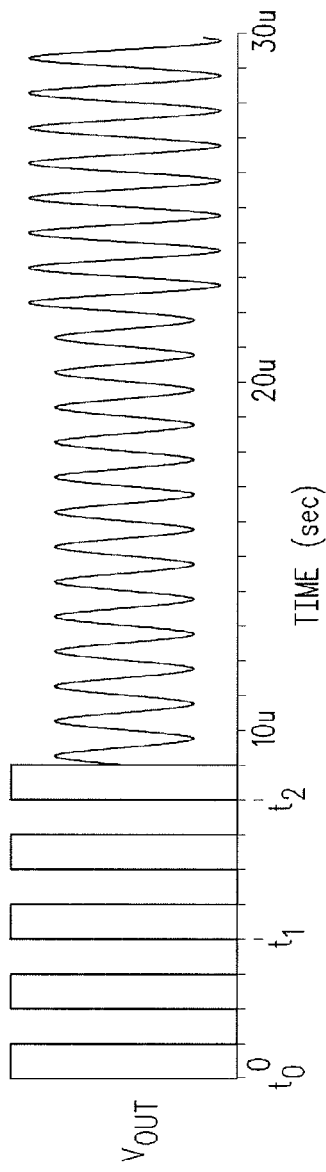
FIG. 7 is a graph of a digital output signal voltage versus time for an analog-to-digital converter, showing overload recovery for an exemplary embodiment.

Referring to FIGS. 5-7, the analog-to-digital converter 5 of FIGS. 1-3 may be used to recover from a runaway condition without short circuiting the integrating capacitors. As shown in FIG. 5 for an exemplary embodiment, at time $t_0$, a large analog input signal, $V_{IN}$, is applied to the input of an analog-to-digital converter, which produces a digital output voltage at the quantizer, $V_{OUT}$, as shown in FIG. 7. The input signal in FIG. 5 causes an overload condition and the analog-to-digital converter does not produce a useful output (e.g., $V_{OUT}$ is not representative of $V_{IN}$). Further, at time $t_1$, when $V_{IN}$ is reduced, the analog-to-digital converter still does not produce a useful output, indicating that the integrator(s) remain overloaded (i.e., a runaway condition). As shown in FIG. 6, at time $t_2$, a switch signal activates the switched resistance element(s) (i.e., by turning on the switch 38). Shortly thereafter, the analog-to-digital converter recovers from the runaway condition caused by the overload, and produces a useful output as shown in FIG. 7. In an exemplary embodiment, the switched resistance element(s) may be deactivated once the overload is no longer present to restore the SNR of the analog-to-digital converter to previous levels.

Figure 8:
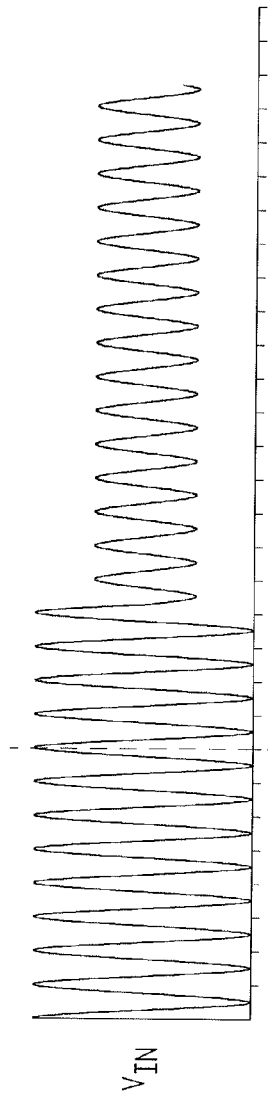
FIG. 8 is a graph of an analog input signal voltage versus time causing an overload for an analog-to-digital converter.
Figure 9:
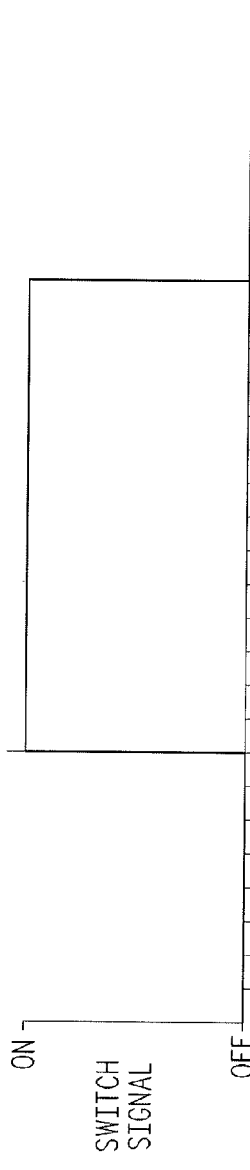
FIG. 9 is a graph of a switch signal versus time for a switched resistance element in an analog-to-digital converter having the overload condition shown in FIG. 8.
Figure 10:
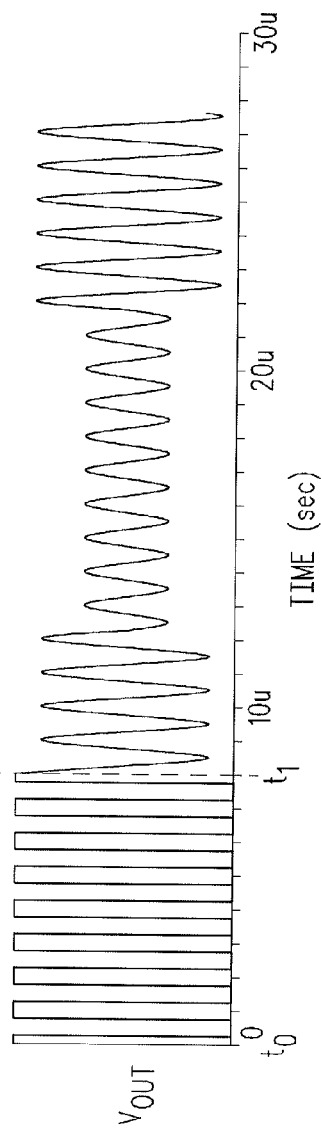
FIG. 10 is a graph of a digital output signal voltage versus time for an analog-to-digital converter, showing operation in the presence of a normally overloading signal for an exemplary embodiment.

Referring to FIGS. 8-10, the analog-to-digital converter of FIGS. 1-3 may also be used to operate a sigma-delta feedback topology in the presence of a large analog input signal that would otherwise cause an overload condition. As shown in FIG. 8 for an exemplary embodiment, at time $t_0$, a large analog input signal is applied to the input of the analog-to-digital converter. This causes an overload condition and the analog-to-digital converter does not produce a useful output, as shown in FIG. 10. In FIGS. 9-10, at time $t_1$, a switch signal activates the switched resistance element(s), and the analog-to-digital converter produces a useful output. In an exemplary embodiment, the switched resistance element(s) is deactivated once the overload is no longer present to restore the SNR of the analog-to-digital converter to previous levels.

As discussed above, by avoiding a hard reset of the integrators 20, 22, 24 (i.e. short circuiting the integrating capacitors 34) the sigma-delta feedback loop is practically unaffected by conditions that would otherwise cause an overload or runaway condition. The analog-to-digital converter can still operate as a higher order sigma-delta topology and is not reduced to lower order approximations. Although the gain of the integrators 20, 22, 24 and the SNR is reduced, it is still possible to obtain useful data from the analog-to-digital converter 5. This enables the use of higher-order sigma-delta feedback topologies without losing data or waiting for corrupt data (i.e., downstream decimation bits) to be flushed out of the system before resuming operation. Additionally, the sigma-delta feedback topology demands less area and power consumption than other higher order design alternatives.

In summary, systems, devices, and methods configured in accordance with example embodiments of the invention relate to:

An apparatus is provided for an analog-to-digital converter. The analog-to-digital converter comprises a first integrator having a first input, wherein the first integrator is configured to produce a first integrated output. A first switched resistance element is coupled between the first input and the first integrated output, wherein the first integrated output is altered when the first switched resistance element is activated. A quantizer is coupled to the first integrated output, the quantizer having a digital output wherein the quantizer converts the first integrated output to a digital value. A digital-to-analog converter is coupled between the digital output and the first input, wherein the digital-to-analog converter converts the digital value to an analog value.

In another embodiment, the analog-to-digital converter further comprises a controller coupled to the first integrator and to the first switched resistance element. The controller is configured to monitor the first integrator for a first condition, activate the first switched resistance element in response to the first condition, and deactivate the first switched resistance element when the first condition no longer exists. In yet another embodiment, the analog-to-digital converter comprises a comparator coupled to the first input and the first switched resistance element, wherein the comparator is configured to detect an overload condition at the first input, and activate the first switched resistance element in response to the overload condition. In another embodiment, the analog-to-digital converter comprises a decimation filter coupled to the digital output of the quantizer, wherein the decimation filter downsamples the digital output.

In another embodiment, the analog-to-digital converter further comprises a second integrator having a second input and configured to produce a second integrated output. The second input is coupled to the digital-to-analog converter, and the second integrated output is coupled to the first input. A second switched resistance element is coupled between the second input and the second integrated output. In an further embodiment, the analog-to-digital converter comprises a controller coupled to the second integrator and to the second switched resistance element, wherein the controller is configured to monitor the second integrator for a first condition, activate the second switched resistance element in response to the first condition, and deactivate the second switched resistance element when the first condition no longer exists.

In another embodiment, the analog-to-digital converter further comprises a third integrator having a third input, wherein the third integrator is configured to produce a third integrated output. The third input is coupled to the digital-to-analog converter, and the third integrated output is coupled to the second input. A third switched resistance element is coupled between the third input and the third integrated output. In a further embodiment, the analog-to-digital converter comprises an analog source coupled to the third input of the third integrator, wherein the analog source provides an analog input signal to the input of the third integrator.

A method is provided for controlling an analog-to-digital converter comprising an integrator having a switched resistance element coupled between an input and an output of the integrator. The method comprises monitoring the analog-to-digital converter for a first condition, and activating the switched resistance element in response to the first condition. In another embodiment, the method further comprises deactivating the switched resistance element when the first condition is no longer present. In another embodiment, monitoring the analog-to-digital converter further comprises detecting the first condition at an input of the analog-to-digital converter. In another embodiment, the method further comprises detecting the first condition at an output of a quantizer, wherein the analog-to-digital converter further comprises a quantizer coupled to the output of the integrator.

An apparatus is provided for an integrator for an analog-to-digital converter. The integrator comprises an amplifier having an input and an output, wherein the amplifier is configured to produce an output signal. An input resistor is coupled to the input of the amplifier and an integrating capacitor is coupled between the input and the output of the amplifier. A switched resistance element is coupled between the input and the output of the amplifier, wherein the output signal is altered when the switched resistance element is activated. The integrator further comprises a controller coupled to the switched resistance element, wherein the controller monitors the amplifier for a first condition, activates the switched resistance element in response to the first condition, and deactivates the switched resistance element when the first condition no longer exists. In another embodiment, the integrator further comprises a comparator coupled to the input of the amplifier and the switched resistance element, wherein the comparator detects a first condition at the input of the amplifier, and activates the switched resistance element in response to the first condition.

In an alternative embodiment, the switched resistance element further comprises a switch coupled to the output of the amplifier, and a feedback resistor coupled between the input of the amplifier and the switch. In another embodiment, when the switch is activated the integrator has a transfer function governed by $$I(s) = \frac{f_s}{s + \frac{R_{in} f_s}{R_f}},$$

where $f_s$ is a sampling frequency of the analog-to-digital converter, $R_{in}$ is the resistance of the input resistor, and $R_f$ is the resistance of the feedback resistor. In another embodiment, when the switch is activated the integrator has a transfer function governed by $$H(s) = \frac{\frac{1}{R_{in} C_f}}{s + \frac{1}{R_f C_f}},$$

where $R_{in}$ is the resistance of the input resistor, $R_f$ is the resistance of the feedback resistor, and $C_f$ is the capacitance of the integrating capacitor. In another embodiment, the feedback resistor is a variable resistor.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An analog-to-digital converter comprising:
   a first integrator having a first input, the first integrator being configured to produce a first integrated output;
   a first switched resistance element coupled between the first input and the first integrated output, wherein the first integrated output is altered when the first switched resistance element is activated;
   a quantizer coupled to the first integrated output, the quantizer having a digital output, wherein the quantizer is configured to convert the first integrated output to a digital value;
   a digital-to-analog converter coupled between the digital output and the first input, wherein the digital-to-analog converter is configured to convert the digital value to an analog value; and
   a controller coupled to the first integrator and to the first switched resistance element, the controller being configured to;
   monitor the first integrator for an overload condition;
   activate the first switched resistance element in response to the first condition; and
   deactivate the first switched resistance element when the first condition no longer exists.

2. The analog-to-digital converter of claim 1, further comprising a comparator coupled to the first input, the comparator being configured to detect the overload condition at the first input.

3. The analog-to-digital converter of claim 1 further comprising a decimation filter coupled to the digital output of the quantizer, wherein the decimation filter is configured to downsample the digital output.

4. The analog-to-digital converter of claim 1, further comprising:
   a second integrator having a second input, the second integrator being configured to produce a second integrated output, wherein the second input is coupled to the digital-to-analog converter, and the second integrated output is coupled to the first input; and
   a second switched resistance element coupled between the second input and the second integrated output.

5. The analog-to-digital converter of claim 4, wherein the controller is coupled to the second integrator and configured to:
   monitor the second integrator for an overload conditon;
   activate the second switched resistance element in response to the overload condition; and
   deactivate the second switched resistance element when the overload condition no longer exists.

6. The analog-to-digital converter of claim 4, further comprising:
   a third integrator having a third input, the third integrator being configured to produce a third integrated output, wherein the third input is coupled to the digital-to-analog converter, and the third integrated output is coupled to the second input; and
   a third switched resistance element coupled between the third input and the third integrated output.

7. The analog-to-digital converter of claim 6, wherein the controller is coupled to the third integrator and configured to:
   monitor the third integrator for an overload condition;
   activate the third switched resistance element in response to the overload condition; and
   deactivate the third switched resistance element when the overload condition no longer exists.

8. The analog-to-digital converter of claim 1, the first switched resistance element being connected to the first input and the first integrated output, wherein the first switched resistance element comprises a switch and a resistor coupled in series between the first input and the first integrated output.

9. The analog-to-digital converter of claim 8, wherein the controller is configured to activate the first switched resistance element by closing the switch and deactivate the first switched resistance element by opening the switch.

10. The analog-to-digital converter of claim 1, wherein the analog-to-digital converter comprises a sigma-delta feedback topology.

11. A method for controlling an analog-to-digital converter, the analog-to-digital converter comprising an integrator having a switched resistance element coupled between an input and an output of the integrator, the method comprising:
   monitoring the analog-to-digital converter for an overload condition; and
   activating the switched resistance element in response to the overload condition.

12. The method of claim 11, further comprising deactivating the switched resistance element when the overload condition is no longer present.

13. The method of claim 12, the switched resistance element comprising a switch and a resistor coupled in series between the input and the output of the integrator, wherein:
   activating the switched resistance element comprises closing the switch in response to the overload condition; and
   deactivating the switched resistance element comprises opening the switch when the overload condition is no longer present.

14. The method of claim 11, wherein monitoring the analog-to-digital converter further comprises detecting the overload condition-at an input of the analog-to-digital converter.

15. The method of claim 11, wherein the analog-to-digital converter further comprises a quantizer coupled to the output of the integrator, and wherein the method further comprises detecting the overload condition-at an output of the quantizer.

16. An integrator for an analog-to-digital converter, the integrator comprising:
   an amplifier having an input and an output, the amplifier being configured to produce an output signal;
   an input resistor coupled to the input of the amplifier;
   an integrating capacitor coupled between the input and the output of the amplifier;
   a switched resistance element coupled between the input and the output of the amplifier; and
   a controller coupled to the switched resistance element, the controller being configured to:
      monitor the amplifier for an overload condition;
      activate the switched resistance element in response to the overload condition, wherein the output signal is altered when the switched resistance element is activated; and
   deactivate the switched resistance element when the overload condition-no longer exists.

17. The integrator of claim 16, further comprising a comparator coupled to the input of the amplifier, the comparator being configured to detect the overload condition at the input of the amplifier.

18. The integrator of claim 16, wherein the switched resistance element further comprises:
   a switch coupled to the output of the amplifier; and
   a feedback resistor coupled between the input of the amplifier and the switch.

19. The integrator of claim 18, wherein the feedback resistor is a variable resistor.

20. The analog-to-digital converter of claim 18, wherein the controller is configured to activate the switched resistance element by closing the switch and deactivate the switched resistance element by opening the switch.

* * * * *